(12) United States Patent
Han et al.

(10) Patent No.: US 11,233,273 B2
(45) Date of Patent: Jan. 25, 2022

(54) METHOD FOR MANUFACTURING ELECTROCHEMICAL DEVICE USING PRETREATMENT DISCHARGE

(71) Applicant: LG CHEM, LTD., Seoul (KR)

(72) Inventors: Jun-Hyeok Han, Daejeon (KR); Kyoung-Ho Ahn, Daejeon (KR); Sol-Ji Park, Daejeon (KR); Chul-Haeng Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 253 days.

(21) Appl. No.: 16/348,372

(22) PCT Filed: Sep. 3, 2018

(86) PCT No.: PCT/KR2018/010234
§ 371 (c)(1),
(2) Date: May 8, 2019

(87) PCT Pub. No.: WO2019/045545
PCT Pub. Date: Mar. 7, 2019

(65) Prior Publication Data
US 2019/0267661 A1    Aug. 29, 2019

(30) Foreign Application Priority Data
Sep. 1, 2017 (KR) .................. 10-2017-0112132

(51) Int. Cl.
*H01L 31/18* (2006.01)
*H01M 10/04* (2006.01)
(Continued)

(52) U.S. Cl.
CPC ........ *H01M 10/058* (2013.01); *G01R 31/389* (2019.01); *H01G 11/34* (2013.01);
(Continued)

(58) Field of Classification Search
CPC .......... H01M 10/058; H01M 8/04302; H01M 10/04; H01M 4/04; H01M 10/052;
(Continued)

(56) References Cited

U.S. PATENT DOCUMENTS

2002/0018935 A1    2/2002  Okada
2009/0181308 A1    7/2009  Chiga et al.
(Continued)

FOREIGN PATENT DOCUMENTS

CN    1332484 A    1/2002
CN    107469093 A    8/2017
(Continued)

OTHER PUBLICATIONS

International Search Report (PCT/ISA/210) issued in PCT/KR2018/010234, dated Dec. 20, 2018.
(Continued)

*Primary Examiner* — Kwang Han
(74) *Attorney, Agent, or Firm* — Birch, Stewart, Kolasch & Birch, LLP (57) ABSTRACT

A method for manufacturing an electrochemical device includes a discharge pretreatment step, where, external electric power is applied to a battery to discharge the battery, before charging the battery for the first time to perform formation of the battery, in order to remove a byproduct layer on the surface of a negative electrode. The method including the discharge pretreatment step before the first charge of a battery can improve the cycle life of an electrochemical device.

12 Claims, 6 Drawing Sheets

(51) Int. Cl.
*H01M 10/052* (2010.01)
*H01M 10/0525* (2010.01)
*H01M 10/0569* (2010.01)
*H01M 10/058* (2010.01)
*H01M 10/44* (2006.01)
*H01M 4/04* (2006.01)
*H01M 4/131* (2010.01)
*H01M 4/134* (2010.01)
*G01R 31/389* (2019.01)
*H01G 11/34* (2013.01)
*H01L 31/0224* (2006.01)
*H01M 6/50* (2006.01)
*H01M 8/04302* (2016.01)

(52) U.S. Cl.
CPC .......... *H01L 31/0224* (2013.01); *H01L 31/18* (2013.01); *H01M 4/04* (2013.01); *H01M 4/131* (2013.01); *H01M 4/134* (2013.01); *H01M 6/50* (2013.01); *H01M 8/04302* (2016.02); *H01M 10/04* (2013.01); *H01M 10/052* (2013.01); *H01M 10/0525* (2013.01); *H01M 10/0569* (2013.01); *H01M 10/44* (2013.01)

(58) Field of Classification Search
CPC ........ H01M 6/50; H01M 4/131; H01M 4/134; H01M 10/0525; H01M 10/0569; H01M 10/44; H01M 2300/0028; H01M 10/446; H01M 4/5825; H01M 4/505; H01M 4/525; H01M 4/0447; H01M 6/5088; H01M 10/049; H01L 31/0224; H01L 31/18; H01L 31/022425; H01G 11/34; G01R 31/389; Y02E 60/10; Y02E 60/13; Y02P 70/50
See application file for complete search history.

(56) References Cited

U.S. PATENT DOCUMENTS

| | | |
|---|---|---|
| 2009/0313814 A1 | 12/2009 | Tsuchida |
| 2013/0244093 A1 | 9/2013 | Min et al. |
| 2014/0125291 A1 | 5/2014 | Hama et al. |
| 2016/0254572 A1* | 9/2016 | Yu ............... H01M 10/058 429/126 |

FOREIGN PATENT DOCUMENTS

| | | |
|---|---|---|
| JP | 9-283125 A | 10/1997 |
| JP | 2009-164082 A | 7/2009 |
| JP | 6078377 B2 | 2/2017 |
| KR | 10-1996-0027018 A | 7/1996 |
| KR | 10-1997-0054779 A | 7/1997 |
| KR | 10-0159885 B1 | 12/1998 |
| KR | 10-2001-0073280 A | 8/2001 |
| KR | 10-2006-0090939 A | 8/2006 |
| KR | 10-2009-0029288 A | 3/2009 |
| KR | 10-2011-0078638 A | 7/2011 |
| KR | 10-1304870 B1 | 9/2013 |
| KR | 10-2014-0014257 A | 2/2014 |
| KR | 10-1474394 B1 | 12/2014 |
| KR | 10-2016-0038735 A | 4/2016 |
| KR | 10-2016-0051059 A | 5/2016 |

OTHER PUBLICATIONS

European Search Report for Appl. No. 18852604.0 dated Jul. 14, 2020.

Gao, J., et al., "Efects of Liquid Electrolytes on the Charge-Discharge Performance of Rechargeable Lithiuam/Sulfur Batteries: Electrochemical and in-Situ X-ray Absorption Spectroscopic Studies," Journal of Physical Chemistry C, Dec. 22, 2011, vol. 115, No. 50, pp. 25132-25137.

* cited by examiner

METHOD FOR MANUFACTURING ELECTROCHEMICAL DEVICE USING PRETREATMENT DISCHARGE

TECHNICAL FIELD

The present disclosure relates to a method for manufacturing an electrochemical device. More particularly, the present disclosure relates to a method for manufacturing an electrochemical device including a discharge pretreatment step before the first charge of a battery.

The present application claims priority to Korean Patent Application No. 10-2017-0112132 filed on Sep. 1, 2017 in the Republic of Korea, the disclosures of which are incorporated herein by reference.

BACKGROUND ART

Recently, energy storage technology has been given an increasing attention. Efforts into research and development for electrochemical devices have been actualized more and more, as the application of energy storage technology has been extended to energy for cellular phones, camcorders and notebook PC and even to energy for electric vehicles. In this context, electrochemical devices have been most spotlighted. Among such electrochemical devices, development of rechargeable secondary batteries has been focused. More recently, active studies have been conducted about designing a novel electrode and battery in order to improve the capacity density and specific energy in developing such batteries.

Among the commercially available secondary batteries, lithium secondary batteries developed in the early 1990's have been spotlighted, since they have a higher driving voltage and significantly higher energy density as compared to conventional batteries, such as Ni-MH, Ni—Cd and sulfuric acid-lead batteries using an aqueous electrolyte.

When charge/discharge proceeds, a lithium secondary battery repeats intercalation/deintercalation of lithium ions from a lithium metal oxide of a positive electrode to an interlayer structure of graphite, etc., forming a negative electrode active material, or deposition or plating of lithium ions on the surface of a metal forming a negative electrode active material. Herein, an electrolyte for a lithium secondary battery reacts with lithium metal or carbon in graphite forming a negative electrode active material to form a thin film called a solid electrolyte interface (SEI, also referred to hereinafter as SEI film) on the surface of the negative electrode. This is known to be one of the main factors causing a change in performance of a battery by affecting the charge transfer. Once the SEI film is formed during the first charge process, it protects reactions between lithium ions and a negative electrode or another material while repeating charge/discharge during the use of a battery, and functions as an ion tunnel through which only lithium ions pass between the electrolyte and the negative electrode.

Meanwhile, the lithium secondary battery is generally obtained by inserting an electrode assembly to a battery casing, injecting an electrolyte thereto, and sealing the battery casing. Then, a formation process is carried out by charging the battery initially to obtain a lithium secondary battery.

Particularly, in the case of a secondary battery using a metal as a negative electrode, the metal surface forming the negative electrode is coated with a byproduct layer. The byproduct layer may be a native oxide layer and/or reactant layer. The native oxide layer refers to a layer formed naturally through the reaction of water, oxygen, carbon dioxide, or the like with a metal on the metal surface. Herein, the resultant native oxide layer may include carbonate, hydroxide, oxide, or the like. For example, when the metal is lithium, the native oxide layer includes $Li_2CO_3$, LiOH and $Li_2O$. In the native oxide layer, $Li_2CO_3$ or LiOH is predominantly distributed at the far side of lithium, while $Li_2O$ is predominantly distributed at the near side of lithium.

The byproduct layer may be coated with a non-uniform thickness on the surface of a negative electrode or non-uniform ingredients may be distributed in the byproduct layer, when a metal is used as a negative electrode for a battery. When the byproduct layer is coated non-uniformly on the surface of the negative electrode, there is a problem in that lithium cannot be deposited or plated uniformly on the surface of the negative electrode during the charge of a battery.

Meanwhile, since the naturally formed byproduct layer does not have uniform thickness and/or ingredients, electron density becomes non-uniform on the surface of the negative electrode. In the surface of the negative electrode having non-uniform electron density, a point with relatively low resistance causes local growth of dendrite with ease, which adversely affects the life of a battery.

DISCLOSURE

Technical Problem

The present disclosure is designed to solve the problems of the related art, and therefore the present disclosure is directed to providing a method for manufacturing an electrochemical device which removes a byproduct layer on the surface of a negative electrode.

The present disclosure is also directed to improving the cycle life of an electrochemical device by removing a byproduct layer on the surface of a metal used as a negative electrode.

These and other objects and advantages of the present disclosure may be realized by the means shown in the appended claims and combinations thereof.

Technical Solution

In one aspect of the present disclosure, there is provided a method for manufacturing an electrochemical device according to the following embodiments.

According to the first embodiment of the present disclosure, there is provided a method for manufacturing an electrochemical device, including the steps of:

forming an electrode assembly including a negative electrode, a positive electrode and a separator interposed between the negative electrode and the positive electrode;

introducing the electrode assembly to a battery casing, injecting an electrolyte into the battery casing and sealing the battery casing to obtain a battery;

carrying out pretreatment by applying external electric power to the battery to discharge the battery to provide a pretreated battery; and charging the pretreated battery for the first time to complete formation of the battery, wherein the electrolyte includes an organic solvent and a lithium salt, and the electrolyte satisfies the following Formula 1:

[(Final charge transfer resistance—Initial charge transfer resistance)/Final charge transfer resistance]×100<100%,   [Formula 1]

wherein a charge transfer resistance (CTR) is calculated by injecting the electrolyte to a lithium/lithium symmetric beaker cell obtained by using lithium metal and plotting the values measured by using electrochemical impedance spectroscopy (EIS) as a function of time, the initial charge transfer resistance is the charge transfer resistance right after injecting the electrolyte to the lithium/lithium symmetric beaker cell, and the final charge transfer resistance is the charge transfer resistance 18 hours after injecting the electrolyte to the lithium/lithium symmetric beaker cell.

According to the second embodiment of the present disclosure, there is provided the method for manufacturing an electrochemical device as defined in the first embodiment, wherein the electrolyte includes, as the organic solvent, at least one of a linear carbonate, a linear ester and a linear ether, and the lithium salt has a molar concentration of 1.8 M to 6 M.

According to the third embodiment of the present disclosure, there is provided the method for manufacturing an electrochemical device as defined in the first or the second embodiment, wherein the organic solvent consists of a cyclic carbonate.

According to the fourth embodiment of the present disclosure, there is provided the method for manufacturing an electrochemical device as defined in the third embodiment, wherein the cyclic carbonate includes a compound represented by the following Chemical Formula 1:

[Chemical Formula 1]

wherein each of $R_1$, $R_2$, $R_3$ and $R_4$ independently represents any one selected from H, a C1-C5 alkyl group, C1-C5 alkylene group, vinylene group or a C1-C5 haloalkyl group.

According to the fifth embodiment of the present disclosure, there is provided the method for manufacturing an electrochemical device as defined in the third embodiment, wherein the cyclic carbonate includes any one selected from: ethylene carbonate; propylene carbonate; 1,2-butylene carbonate; 2,3-butylene carbonate; 1,2-pentylene carbonate; 2,3-pentylene carbonate; vinylene carbonate; vinylethylene carbonate; halides thereof, or combinations thereof.

According to the sixth embodiment of the present disclosure, there is provided the method for manufacturing an electrochemical device as defined in any one of the first to the fifth embodiments, wherein the electrolyte includes ethylene carbonate and propylene carbonate.

According to the seventh embodiment of the present disclosure, there is provided the method for manufacturing an electrochemical device as defined in the sixth embodiment, wherein a volume ratio of ethylene carbonate to propylene carbonate is 5:95-95:5.

According to the eighth embodiment of the present disclosure, there is provided the method for manufacturing an electrochemical device as defined in any one of the first to the seventh embodiments, wherein the carrying out pretreatment step is carried out twice or more.

According to the ninth embodiment of the present disclosure, there is provided the method for manufacturing an electrochemical device as defined in any one of the first to the eighth embodiments, wherein the carrying out pretreatment step includes the following steps:
  carrying out a first discharge pretreatment;
  increasing the voltage of the battery; and
  carrying out a second discharge pretreatment.

According to the tenth embodiment of the present disclosure, there is provided the method for manufacturing an electrochemical device as defined in any one of the first to the ninth embodiments, wherein the negative electrode has a potential of 0-1.0V before the carrying out pretreatment step.

According to the eleventh embodiment of the present disclosure, there is provided the method for manufacturing an electrochemical device as defined in any one of the first to the tenth embodiments, wherein the positive electrode has a potential of 1.0V or more and the negative electrode has a potential of 0-1.0V at the end of the carrying out pretreatment step.

According to the twelfth embodiment of the present disclosure, there is provided the method for manufacturing an electrochemical device as defined in any one of the first to the eleventh embodiments, which further includes a step of analyzing a byproduct layer formed during injecting of the electrolyte into the battery casing before the carrying out pretreatment step.

According to the thirteenth embodiment of the present disclosure, there is provided the method for manufacturing an electrochemical device as defined in any one of the first to the twelfth embodiments, wherein the carrying out pretreatment step is carried out by converting a battery capacity as a function of a thickness of a byproduct layer formed during injecting of the electrolyte into the battery casing.

According to the fourteenth embodiment of the present disclosure, there is provided the method for manufacturing an electrochemical device as defined in any one of the first to the thirteenth embodiments, wherein the negative electrode includes, as a negative electrode active material, any one of alkali metals, alkaline earth metals, Group 3B metals and transition metals, or combinations thereof.

According to the fifteenth embodiment of the present disclosure, there is provided the method for manufacturing an electrochemical device as defined in any one of the first to the fourteenth embodiments, wherein the alkali metals include any one of lithium (Li), sodium (Na), potassium (K), rubidium (Rb), cesium (Cs), francium (Fr), or combinations thereof.

According to the sixteenth embodiment of the present disclosure, there is provided the method for manufacturing an electrochemical device as defined in any one of the first to the fifteenth embodiments, wherein the positive electrode includes, as a positive electrode active material, any one selected from the group consisting of $LiCoO_2$, $LiNiO_2$, $LiMn_2O_4$, $LiCoPO_4$, $LiFePO_4$, $LiNiMnCoO_2$, $LiNi_{1-x-y-z}Co_xM1_yM2_zO_2$ (wherein each of M1 and M2 independently represents any one selected from the group consisting of Al, Ni, Co, Fe, Mn, V, Cr, Ti, W, Ta, Mg and Mo, each of x, y and z independently represents an atomic proportion of an element forming the oxides, and $0 \leq x < 0.5$, $0 \leq y < 0.5$, $0 \leq z < 0.5$, $0 < x+y+z \leq 1$), and mixtures thereof.

According to the seventeenth embodiment of the present disclosure, there is provided the method for manufacturing an electrochemical device as defined in any one of the first to the sixteenth embodiments, wherein the electrochemical device is a lithium metal battery.

Advantageous Effects

The method for manufacturing an electrochemical device according to the present disclosure includes, after the step of injecting an electrolyte to a battery and before carrying out formation of the battery by charging the battery for the first time, a pretreatment step of applying external electric power to the battery to perform discharge. The method for manufacturing an electrochemical device according to the present disclosure has an effect of removing a byproduct layer of the surface of a negative electrode by carrying out the discharge pretreatment. In addition, the method for manufacturing an electrochemical device according to the present disclosure has the effects of reducing the resistance of a battery and inhibiting growth of dendrite on the surface of a negative electrode.

Further, the method for manufacturing an electrochemical device according to the present disclosure can improve the life of an electrochemical device by carrying out the discharge pretreatment before the first formation step of the battery.

The electrochemical device according to the present disclosure undergoes a decrease in positive electrode potential and an increase in negative electrode potential through polarization during the discharge pretreatment. However, the range of a change in positive electrode/negative electrode potential is not higher than the oxidation potential of the electrolyte and is not lower than the reduction potential thereof. Thus, any side reaction, such as reduction/oxidation of the electrolyte, does not occur during the discharge pretreatment.

In addition, in the electrochemical device according to the present disclosure, no lithium metal is deposited at the positive electrode.

Meanwhile, the different in potential between the negative electrode and the positive electrode is not excessively large, there is no collapse of the structure of the positive electrode active material or no additional lithium intercalation occurs. Additionally, it is possible to inhibit formation of an alloy between a metallic material used as a positive electrode current collector at the positive electrode and a material used as a positive electrode active material.

Further, according to the present disclosure, an electrolyte including an organic solvent consisting of a cyclic carbonate is injected to provide an effect of improving the life of an electrochemical device.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the scope of the disclosure.

The present disclosure relates to a method for manufacturing an electrochemical device.

In the method for manufacturing an electrochemical device according to the present disclosure, after the battery is obtained and before carrying out the first charge of a battery during a formation step, a discharge pretreatment step is carried out. It is possible to remove a byproduct layer of the surface of a negative electrode simultaneously with deintercalation of metal ions from the negative electrode by the discharge pretreatment step. In addition, it is possible to reduce the resistance of a battery, to inhibit growth of dendrite, and to improve the cycle life of an electrochemical device.

Figure 1:
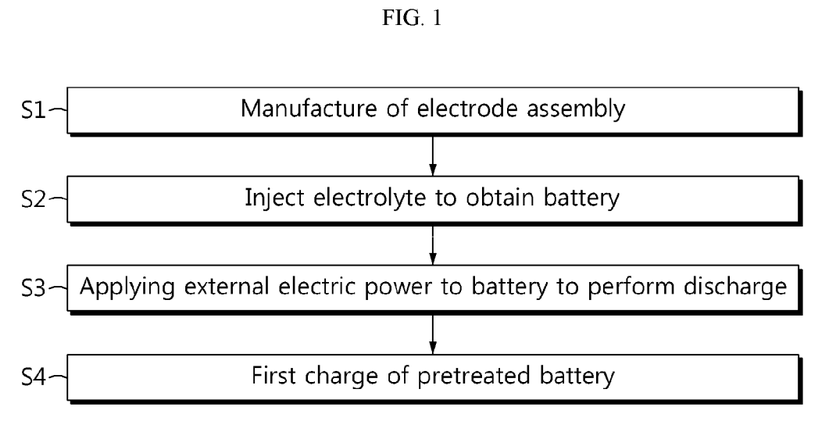
FIG. 1 is a flow chart illustrating the method for manufacturing an electrochemical device according to the present disclosure.

FIG. 1 is a flow chart illustrating the method for manufacturing an electrochemical device according to an embodiment of the present disclosure. Hereinafter, the present disclosure will be described in detail with reference to FIG. 1.

Referring to FIG. 1, the method for manufacturing an electrochemical device includes the steps of: (S1) forming an electrode assembly including a negative electrode, a positive electrode and a separator interposed between the negative electrode and the positive electrode; (S2) introducing the electrode assembly to a battery casing, injecting an electrolyte thereto and sealing the battery casing to obtain a battery; (S3) carrying out pretreatment by applying external electric power to the battery to discharge the battery; and (S4) charging the pretreated battery for the first time to perform formation of the battery.

The electrochemical device obtained by the above-described method includes any device carrying out electrochemical reactions. Particular examples of the electrochemical device include primary batteries, secondary batteries, solar cells, super capacitors, storage batteries or fuel cells. Particularly, the secondary batteries include lithium metal secondary batteries, lithium ion secondary batteries, lithium polymer secondary batteries, or lithium ion polymer secondary batteries. However, since the side reaction caused by a byproduct layer most predominantly occurs in a lithium metal secondary battery using lithium metal as a negative electrode, the method is preferably applied to a lithium metal secondary battery. Hereinafter, a lithium metal secondary battery will be explained as a typical example.

First, an electrode assembly including a negative electrode, a positive electrode and a separator interposed between the negative electrode and the positive electrode is provided (S1).

The step of providing an electrode assembly (S1) is carried out by forming the negative electrode and the positive electrode, and then interposing the separator between the negative electrode and the positive electrode to obtain the electrode assembly. There is no particular limitation in the method for manufacturing an electrode assembly and any known method may be used. In addition, there is no particular limitation in the structure of the electrode assembly, as long as it includes a negative electrode, a positive electrode and a separator interposed between the negative electrode and the positive electrode. Particular examples of the structure include jelly-roll type, stacked type or stacked/folded type structures.

According to an embodiment of the present disclosure, the negative electrode may include a current collector and a negative electrode active material layer formed on the surface of the current collector, wherein the negative electrode active material layer has a byproduct layer formed on the surface thereof.

The negative electrode active material layer may include at least one selected from alkali metals, alkaline earth metals, Group 3B metals and transition metals. Non-limiting examples of the alkali metals include any one selected from lithium (Li), sodium (Na), potassium (K), rubidium (Rb), cesium (Cs) and francium (Fr), or a combination of two or more of them. Non-limiting examples of the alkaline earth metals include any one selected from beryllium (Be), magnesium (Mg), calcium (Ca), strontium (Sr), barium (Ba) and radium (Ra), or a combination of two or more of them. Non-limiting examples of the Group 3B metals include any one selected from aluminum (Al), gallium (Ga), indium (In) and thallium (Tl), or a combination of two or more them. Non-limiting examples of the transition metals include any one selected from nickel (Ni), copper (Cu), zinc (Zn), cobalt (Co), manganese (Mn) and chromium (Cr), or a combination of two or more of them.

According to an embodiment of the present disclosure, the negative electrode active material layer may include at least one of metal foil, metal alloys and powder thereof. According to another embodiment of the present disclosure, the negative electrode may be obtained by coating, binding, pressing or depositing metal foil on a planar current collector. In a variant, the negative electrode may be obtained by applying metal powder onto a current collector. Meanwhile, the negative electrode may include metal foil or metal alloys alone without any current collector. According to still another embodiment of the present disclosure, the negative electrode may be obtained by binding or pressing lithium metal physically to a negative electrode current collector. According to yet another embodiment of the present disclosure, the negative electrode may be obtained by electrodeposition or chemical vapor deposition of lithium metal on a current collector.

According to an embodiment of the present disclosure, when the negative electrode active material is incorporated in a negative electrode active material layer in the shape of particles, a byproduct layer may be formed on the surface of the negative electrode active material particles.

According to an embodiment of the present disclosure, the metal may include at least one selected from the above-mentioned alkali metals, alkaline earth metals, Group 3B metals and transition metals.

Meanwhile, the byproduct layer according to the present disclosure means a layer formed naturally on the surface of a negative electrode before the first charge of a battery. Particularly, the byproduct layer may include at least one selected from a native oxide layer, a reactant layer formed by the reaction with an electrolyte, and a reactant layer formed by the reaction of the native oxide layer with an electrolyte.

Metal includes a metal surface coated with a native oxide layer. The native oxide layer means a layer formed naturally on the metal surface by the metal that is in contact with water or ambient oxygen or carbon dioxide. The native oxide layer may include a carbonate, hydroxide, oxide, or the like. For example, when the metal is lithium, the native oxide layer includes lithium carbonate, lithium hydroxide and lithium oxide, such as $Li_2CO_3$, $LiOH$ and $Li_2O$. In the native oxide layer, $Li_2CO_3$ or $LiOH$ is distributed largely at the far side of lithium and $Li_2O$ is distributed largely at the near side of lithium.

The reactant layer means a layer formed naturally through the reaction of the negative electrode active material layer with an electrolyte, before the first charge of a battery, i.e., in the absence of current application.

The byproduct layer may be the native oxide layer coated with the reactant layer, a combination of the native oxide layer with the reactant layer, or the native oxide layer coated with the reactant layer and combined with the reactant layer.

Figure 3:
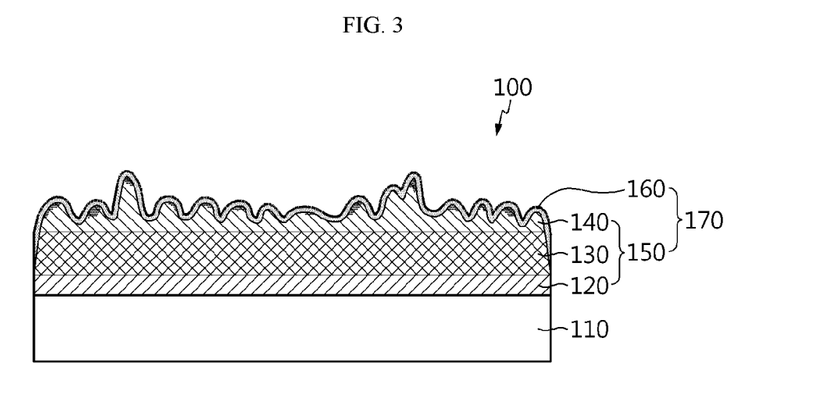
FIG. 3 is a schematic view illustrating a negative electrode coated with a byproduct layer.

FIG. 3 is a schematic view illustrating a negative electrode coated with a byproduct layer. Particularly, in a secondary battery using lithium metal as a negative electrode 100, the surface 110 of lithium metal is coated with a native oxide layer 150. The native oxide layer includes $Li_2CO_3$, $LiOH$, $Li_2O$, or the like, wherein $Li_2CO_3$ or $LiOH$ is distributed largely at the far side 140 of lithium and $Li_2O$ is distributed largely at the near side 120 of lithium. In addition, in the intermediate portion 130 of the native oxide layer, $Li_2CO_3$, $LiOH$ and $Li_2O$ are randomly distributed. In addition, the byproduct layer 170 may be further coated with the native oxide layer 150 and the reactant layer 160 formed on the native oxide layer through the reaction with an electrolyte, or the native oxide layer may be present in combination with the reactant layer. The native oxide layer and the reactant layer are generally called a byproduct layer.

In the case of a secondary battery including metal as a negative electrode active material, the negative electrode surface may be coated with the naturally formed byproduct layer to a non-uniform thickness. In addition, in the byproduct layer, the ingredients forming the same may be distributed randomly.

When the byproduct layer coated on the negative electrode surface has a non-uniform thickness or includes the ingredients distributed non-uniformly, there is a problem of non-uniform deposition or plating of lithium on the negative electrode surface during the charge of a secondary battery.

In addition, when the byproduct layer coated on the negative electrode surface has a non-uniform thickness or includes the ingredients distributed non-uniformly, electron density on the negative electrode surface becomes non-uniform. At the portion having low electron density, i.e., low resistance, growth of dendrite may occur with ease. The formed dendrite causes a problem related with stability, such as an internal short-circuit or ignition, and adversely affects the life of a battery.

To solve the above-mentioned problems, a pretreatment step of discharging a battery is carried out before the first charge (i.e. formation) of a battery cell according to the present disclosure. It is possible to remove the byproduct layer on the negative electrode surface by carrying out the pretreatment step. In addition, it is possible to improve the life of a secondary battery through uniform lithium deposition or plating.

Meanwhile, the principle of formation of a byproduct layer according to the present disclosure is different from that of the conventional SEI layer. The byproduct layer according to the present disclosure means a layer formed naturally before the first charge (i.e., before the application of electric current).

More particularly, when a metal is used as a negative electrode active material, the byproduct layer may include a native oxide layer formed naturally on the negative electrode surface and a reactant layer formed naturally by the reaction of the negative electrode surface with an electrolyte.

According to an embodiment of the present disclosure, when a metal, such as lithium foil, is used as a negative electrode active material, the reactant layer may be formed simultaneously with the injection of an electrolyte, after introducing the electrode assembly to a battery casing. In other words, as soon as the electrolyte meets the metal, the reactant layer may be formed.

On the contrary, when a metal, such as lithium foil, is used as a negative electrode active material, an SEI layer means a thin layer formed during the first charge step after the discharge pretreatment step.

Meanwhile, when a carbonaceous material is used as a negative electrode active material, for example, in the case of a battery including graphite, an SEI layer is formed during the first charge step after manufacturing the battery. This is because the negative electrode surface is in contact with the electrolyte to cause the oxidation-reduction decomposition of the electrolyte ingredients at the interface, while the negative electrode using graphite undergoes a drop in potential during the first charge step. Herein, the decomposition product is deposited or adsorbed to the section of the negative electrode to form the SEI layer.

Therefore, the byproduct layer to be removed by carrying out the discharge pretreatment step before the first charge step according to the present disclosure does not mean the conventional SEI layer but means the native oxide layer and/or the reactant layer with the electrolyte formed naturally before the first charge step.

According to the present disclosure, it is possible to obtain a uniform negative electrode surface by removing the byproduct layer having a non-uniform surface and/or non-uniform ingredients. Such a uniform negative electrode surface may form a negative electrode surface having a uniform thickness and/or desired ingredients during the subsequent first charge step. In addition, it is possible to form an SEI layer having a uniform thickness and/or desired ingredients.

In other words, the present disclosure is directed to carrying out uniform deposition or plating of lithium, when charging a secondary battery subsequently, by removing the byproduct layer formed naturally on the negative electrode surface before the first charge step.

Meanwhile, according to an embodiment of the present disclosure, the positive electrode may include a current collector and a positive electrode active material layer formed on the surface of the current collector. According to another embodiment of the present disclosure, the positive electrode may be obtained by applying the positive electrode active material onto the positive electrode current collector, followed by drying. A binder and a conductive material may be further incorporated, if desired.

In general, the positive electrode current collector is formed to have a thickness of 3-500 μm. The positive electrode current collector is not particularly limited, as long as it causes no chemical change in the corresponding battery and has high conductivity. Particular examples of the positive electrode current collector may include stainless steel; aluminum; nickel; titanium; baked carbon; copper; stainless steel surface-treated with carbon, nickel, titanium or silver; or the like. It is possible to increase the adhesion of a positive electrode active material by forming fine surface irregularities on the surface of a current collector. The positive electrode current collector may have various shapes, such as a film, sheet, foil, net, porous body, foam and a non-woven web body.

In addition, the positive electrode active material may be any one selected from the group consisting of $LiCoO_2$, $LiNiO_2$, $LiMn_2O_4$, $LiCoPO_4$, $LiFePO_4$, $LiNiMnCoO_2$ and $LiNi_{1-x-y-z}Co_xM1_yM2_zO_2$ (wherein each of M1 and M2 independently represents any one selected from the group consisting of Al, Ni, Co, Fe, Mn, V, Cr, Ti, W, Ta, Mg and Mo, each of x, y and z independently represents an atomic proportion of an element forming the oxides, and $0 \leq x < 0.5$, $0 \leq y < 0.5$, $0 \leq z < 0.5$, $0 < x+y+z \leq 1$), or a combination of two or more of them.

The separator is not particularly limited, as long as it allows electrical insulation between the positive electrode and the negative electrode. The separator is interposed between the positive electrode and the negative electrode, and any insulating thin film having high ion permeability and mechanical strength is used as the separator. The separator generally has a pore diameter of 0.01-10 μm and a thickness of 5-300 μm. Particular examples of the separator include sheets or nonwoven webs made of olefinic polymers, such as polyethylene and polypropylene, having chemical resistance and hydrophobic property; glass fibers or polyethylene, or the like. If desired, an inorganic coating layer containing inorganic particles may be further formed on the outermost surface of the separator in order to increase the heat resistance and stability of the separator.

Next, the electrode assembly is introduced to a battery casing, an electrolyte is injected thereto and the battery casing is sealed to obtain a battery (S2).

The battery casing may be selected suitably depending on the shape of the electrode assembly and the purpose of use of the battery. For example, when the battery casing is a pouch-type casing, an aluminum laminate pouch including aluminum layers may be used. After injecting the electrolyte, the opening of the aluminum laminate pouch may be sealed by hot welding or hot fusion.

The electrolyte includes an organic solvent and a lithium salt.

According to the present disclosure, the electrolyte has low reactivity with lithium metal.

When an electrolyte having high reactivity with lithium metal is used, the electrolyte is in contact with the negative electrode surface again even after carrying out the discharge pretreatment, thereby forming a new byproduct layer. In this case, it is not possible to obtain a sufficient effect of improving the life characteristics.

On the contrary, according to the present disclosure, the above-mentioned problem can be solved by using an electrolyte having low reactivity with lithium metal. In other words, the byproduct layer is removed by carrying out discharge pretreatment according to the present disclosure. In addition, according to the present disclosure, an electrolyte having low reactivity with lithium metal is injected to the battery so that an electrode surface cleaned after carrying out the discharge pretreatment may be retained for a predetermined time. Thus, it is possible to provide an excellent effect of improving the life characteristics.

Figure 6:
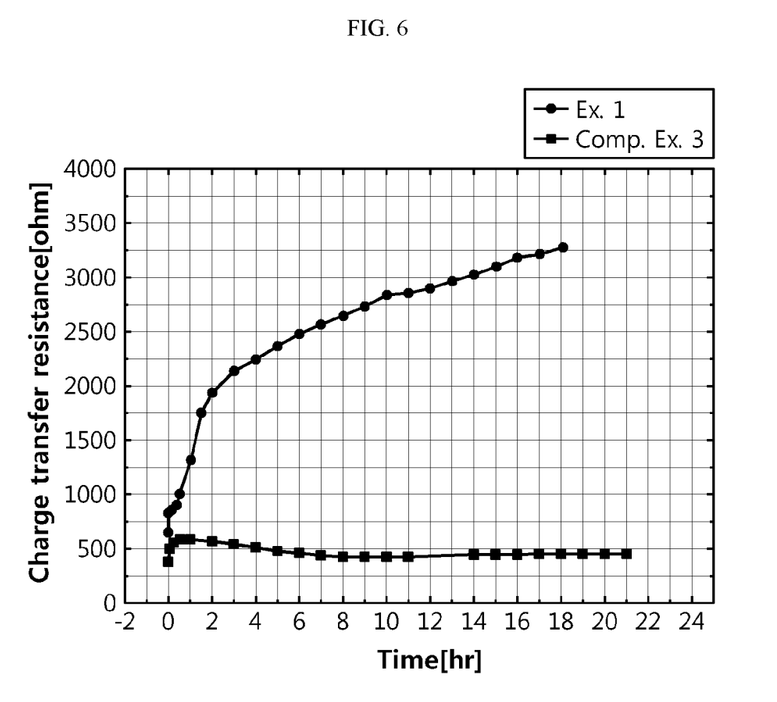
FIG. 6 is a graph illustrating the reactivity with lithium metal of each of the electrolytes used according to Example 1 and Comparative Example 3.

As shown in FIG. 6, through the tests, the inventors of the present disclosure have found that when a battery using an electrolyte having low reactivity with lithium metal injected thereto is subjected to the discharge pretreatment, it is possible to provide a significantly high effect of improving the life characteristics. On the contrary, when a battery including an electrolyte having high reactivity with lithium metal injected thereto is subjected to the discharge pretreatment, it is not possible to provide a sufficient effect of improving the life characteristics.

Meanwhile, according to the present disclosure, the electrolyte satisfies the following Formula 1:

[(Final charge transfer resistance—Initial charge transfer resistance)/Final charge transfer resistance]×100<100%, [Formula 1]

wherein the charge transfer resistance means the resistance at the interface between the electrolyte and the electrode.

In Formula 1, the charge transfer resistance (CTR) is calculated by injecting the electrolyte to a lithium/lithium symmetric beaker cell obtained by using lithium metal and plotting the values measured by using electrochemical impedance spectroscopy (EIS) as a function of time, the initial charge transfer resistance is the charge transfer resistance right after injecting the electrolyte to the lithium/lithium symmetric beaker cell, and the final charge transfer resistance is the charge transfer resistance 18 hours after injecting the electrolyte to the lithium/lithium symmetric beaker cell.

Figure 7:
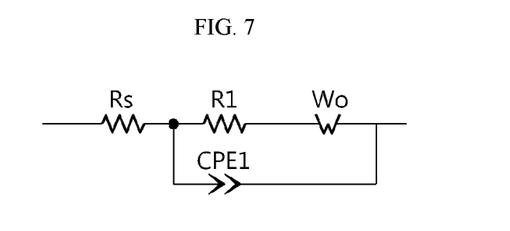
FIG. 7 illustrates the equivalent circuit model according to an embodiment of the present disclosure.

Particularly, the charge transfer resistance may be calculated by using the equivalent circuit model as shown in FIG. 7, after the measurement using electrochemical impedance spectroscopy.

The equivalent circuit model includes the electrolyte resistance (Rs), charge transfer resistance (R1) at the interface between the electrolyte and the electrode, a constant phase element (CPE) and Warburg impedance (Wo).

According to an embodiment of the present disclosure, the electrolyte includes an organic solvent and a lithium salt, and the organic solvent may include any one selected from a linear carbonate, a linear ester and a linear ether and a cyclic carbonate.

Figure 8:
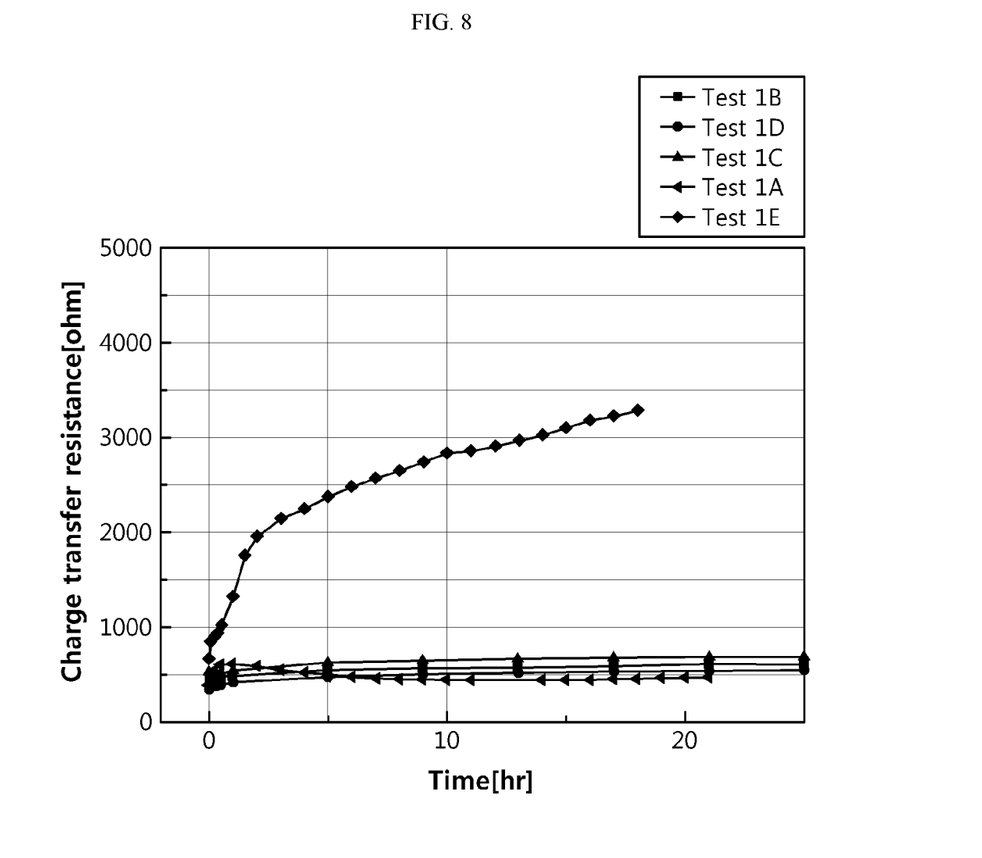
FIG. 8 is a graph illustrating the reactivity with lithium metal depending on the type of an organic solvent.

FIG. 8 is a graph illustrating the reactivity with lithium metal depending on the type of an organic solvent.

According to an embodiment of the present disclosure, the electrolyte may consist of a cyclic carbonate as an organic solvent. When using a cyclic carbonate alone as an organic solvent, the lithium salt may be one used conventionally in the field of electrochemical devices. The lithium salt may be used at a concentration used conventionally in the field of electrochemical devices, such as 0.5-1.5 M. When using a cyclic carbonate alone as an organic solvent, it has low reactivity with lithium metal, and thus can improve the life characteristics of a battery even after the discharge pretreatment. Meanwhile, when using an organic solvent consisting of a cyclic carbonate alone, a lithium salt used conventionally for an electrochemical device may be used at a concentration used conventionally for an electrochemical device.

According to an embodiment of the present disclosure, the cyclic carbonate may include a compound represented by the following Chemical Formula 1:

[Chemical Formula 1]

wherein each of $R_1$, $R_2$, $R_3$ and $R_4$ independently represents any one selected from H, a C1-C5 alkyl group, C1-C5 alkylene group, vinylene group or a C1-C5 haloalkyl group.

According to an embodiment of the present disclosure, the cyclic carbonate may include any one selected from: ethylene carbonate; propylene carbonate; 1,2-butylene carbonate; 2,3-butylene carbonate; 1,2-pentylene carbonate; 2,3-pentylene carbonate; vinylene carbonate; vinylethylene carbonate; and halides thereof, or a combination of two or more of them.

According to an embodiment of the present disclosure, the electrolyte may include ethylene carbonate and propylene carbonate.

In addition, according to an embodiment of the present disclosure, the volume ratio of ethylene carbonate to propylene carbonate may be 5:95-95:5, 10:90-90:10, or 30:70-50:50. When the content of the cyclic carbonate satisfies the above-defined range, is it possible to improve the processability since ethylene carbonate present in a solid phase at room temperature is not used alone. It is also possible to form an SEI layer having improved durability.

According to an embodiment of the present disclosure, when the electrolyte includes at least one selected from a linear carbonate, linear ester and a linear ether, the lithium salt may be used at a molar concentration ranging from a lower limit of 1.8 M, 2 M, 2.2 M or 2.8 M to an upper limit of 6 M, 4 M or 3.6 M, and the molar concentration range may be a combination of each of the upper limits with each of the lower limits. For example, the lithium salt may be used at a molar concentration of 1.8-6 M, 2-4 M, or 2.2-3.6 M.

Within the above-defined range, a range of 2-4 M is preferred in terms of ion conductivity, viscosity and surface tension. Particularly, when the molar concentration of lithium salt is higher than 6 M, the electrolyte may have poor ion conductivity and show low wettability with the constitutional elements of a battery. When the molar concentration of lithium salt is lower than 1.8 M, reactivity with lithium metal is increased to cause a problem of side reactions.

Figure 9:
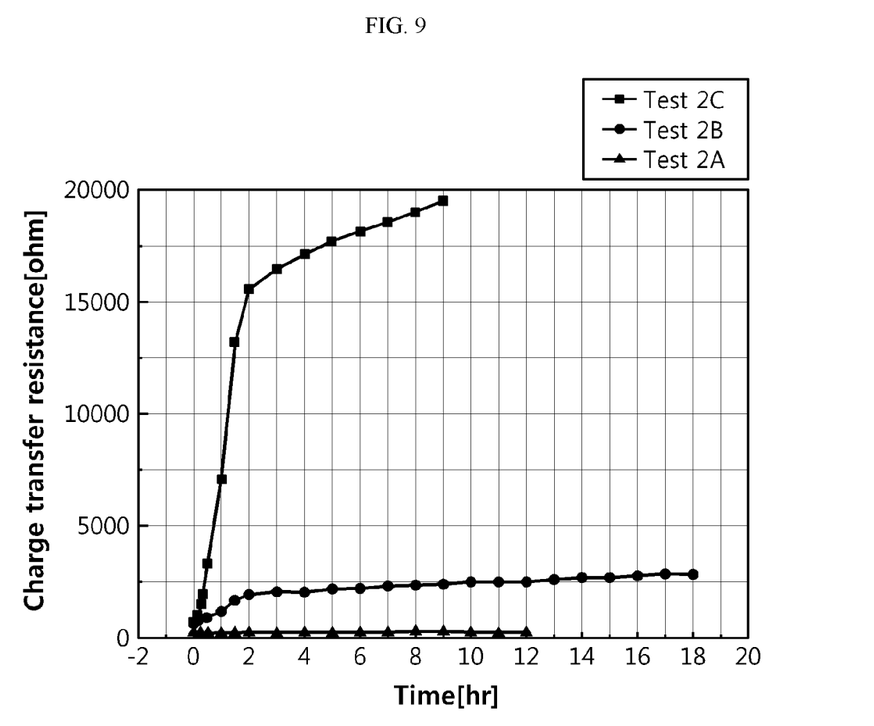
FIG. 9 is a graph illustrating the reactivity with lithium metal as a function of lithium salt concentration.

FIG. 9 is a graph illustrating the reactivity with lithium metal as a function of lithium salt concentration.

When using a linear carbonate or linear ether as an organic solvent as mentioned above, such a high molar concentration of lithium salt may improve the life characteristics of a battery after the discharge pretreatment by virtue of low reactivity of the electrolyte with lithium metal.

According to an embodiment of the present disclosure, the linear carbonate may include a compound represented by the following Chemical Formula 2:

$R_5COOR_6$ [Chemical Formula 2]

wherein each of $R_5$ and $R_6$ independently represents any one selected from a linear or branched alkyl group, H, a C1-C5 alkyl group, C1-C5 alkylene group, vinylene group and a C1-C5 haloalkyl group.

According to an embodiment of the present disclosure, the linear carbonate may include dimethyl carbonate (DMC), diethyl carbonate (DEC), dipropyl carbonate (DPC), ethylmethyl carbonate (EMC), methylpropyl carbonate (MPC), ethylpropyl carbonate (EPC), or a combination of two or more of them.

According to an embodiment of the present disclosure, the linear ester may include methyl propionate, ethyl propionate, propyl propionate, butyl propionate, ethyl acetate, or a combination of two or more of them.

According to an embodiment of the present disclosure, the linear ether may include dimethyl ether, diethyl ether, dipropyl ether, methyl ethyl ether, methyl propyl ether, ethyl propyl ether, 1,2-dimethoxyethane, or a combination of two or more of them.

The lithium salt is not particularly limited, may include any lithium salt used conventionally for an electrolyte for a lithium secondary battery, and particular examples thereof include $LiPF_6$, LiFSi, LiTFSi, LiBOB, $LiAsF_6$, $LiCF_3SO_3$, $LiN(CF_3SO_2)_2$, $LiBF_4$, $LiBF_6$, $LiSbF_6$, $LiN(C_2F_5SO_2)_2$, $LiAlO_4$, $LiAlCl_4$, $LiSO_3CF_3$ and $LiClO_4$. Such lithium salts may be used alone or in combination.

According to an embodiment, the method may further include an aging step wherein the battery is stored for a predetermine period of time after step (S2). It is possible to increase the wetting characteristics of a battery through the aging step. The aging step may be carried out under different conditions, such as time or temperature, depending on the purpose of use, specification of a finished product, structure of a battery cell, or the like. According to another embodiment of the present disclosure, the aging step may be carried out for 1-3 days.

Then, external electric power is applied to the battery to carry out discharge pretreatment (S3).

In general, during the manufacture of a secondary battery, a battery is obtained and then charged for the first time to perform formation of the battery.

On the contrary, according to the present disclosure, an electrolyte is injected to a secondary battery and the battery is discharged preliminarily before the first charge. In this manner, it is possible to remove a byproduct layer of a negative electrode surface.

The external electric power is not particularly limited, as long as it allows discharge of the battery. For example, the external electric power may be derived from a battery power converter (TOYO system).

In step (S3), discharge may be carried out in a constant current (CC) mode. According to an embodiment of the present disclosure, the intensity of discharge current may be controlled in an adequate range considering the ingredients and/or thickness of the byproduct layer to be removed. For example, discharge may be carried out at a C rate of 0.0001-10 C, 0.001-5 C, or 0.01-1 C. Particularly, the C rate may range from a lower limit of 0.0001 C or more, 0.001 C or more, or 0.01 C or more to an upper limit of 10 C or less, 5 C or less, or 1 C or less, and any combination of each upper limit with each lower limit may be used.

According to an embodiment of the present disclosure, in step (S3), discharge may be carried out by converting the battery capacity as a function of the thickness of the byproduct layer.

Particularly, before carrying out step (S3), the byproduct layer may be analyzed. For example, the method may further include a step of carrying out analysis of the ingredients and/or thickness of the byproduct layer, before carrying out step (S3). According to an embodiment of the present disclosure, analysis of the byproduct layer may be carried out by using a method, such as X-ray photoelectron spectroscopy, or the like.

Such analysis is carried out to set a discharge condition suitable for removing the byproduct layer, before carrying out discharge. For example, it is possible to control C rate conditions, voltage conditions of applied power sources, discharge levels (capacity at discharge cut-off), or the like, depending on the thickness of the byproduct layer. In addition, according to an embodiment of the present disclosure, setting of the discharge conditions may be derived inductively from data obtained through many times of experiments.

For example, the capacity of the byproduct layer may be calculated by the following method:

First, the capacity per thickness of a lithium electrode is determined. Particularly, a lithium/lithium symmetric beaker cell is prepared, lithium of the negative electrode is totally transported to the positive electrode, and then the capacity is measured.

Next, X-ray photoelectron spectroscopy (XPS) is used to measure the thickness of the byproduct layer and the measured thickness is converted into capacity.

For example, when using a lithium electrode having a thickness of 20 μm, the lithium electrode has a capacity per thickness of 3.1 mAh/20 μm. Herein, the byproduct layer formed on the lithium electrode has a thickness of 50 nm. The battery capacity of a byproduct layer can be calculated by using a proportional expression from the above-measurements as follows: 3.1 mAh:20 μm=X:50 nm, and thus the capacity is 0.00775 mAh. Then, discharge pretreatment is carried out to the level same as the calculated capacity, thereby removing the byproduct layer.

In addition, according to an embodiment of the present disclosure, after step (S3) and before step (S4), the battery may be allowed to restore its voltage and then discharged again. In the case of a byproduct layer having an excessively large thickness, when discharge is carried out at an excessively high C rate or the positive electrode potential is dropped excessively to remove the byproduct layer at once, the cell voltage may affect the positive electrode materials. For example, in the case of a positive electrode including $LiCoO_2$, when the positive electrode potential is dropped to 1.2 V or less, side reactions may occur and particular examples thereof include oxidation/reduction of an electrolyte, collapse of the positive electrode, additional lithium intercalation into the positive electrode, lithium metal deposition on the positive electrode, or the like.

According to an embodiment of the present disclosure, the above-mentioned step may be carried out by allowing the battery to restore its voltage after a rest time and applying external electric power again to perform discharge. The restoration of voltage refers to an increase in voltage of a battery after a predetermined time. For example, in the case of a secondary battery using lithium for a negative electrode active material layer, when the voltage is dropped to 1.5 V or less while the byproduct layer is not removed completely through the first discharge pretreatment, the voltage may be increased again after a rest time. For example, the voltage may be restored to about 2.0 V. Then, external electric power is applied again to the restored battery to perform the second discharge treatment. In this manner, it is possible to remove the remaining byproduct layer completely.

According to an embodiment of the present disclosure, the potential of a positive electrode active material is the potential in the natural state, i.e., the potential before the first charge. The potential varies with the particular type of a positive electrode active material. For example, before discharge, the positive electrode may have a potential of 2.5-4.0 V, 2.8-3.5 V, or 2.9-3.3 V. Meanwhile, for example, the negative electrode may have a potential of 0-1.0 V, 0-0.8 V, or 0-0.5 V, before discharge. Particularly, the positive electrode may have a potential ranging from a lower limit of 2.5 V or more, 2.8 V or more, or 2.9 V or more to an upper limit of 4.0 V or less, specifically 3.5 V or less, or 2.9 V or less, and any combination of each upper limit with each lower limit may be used. Particularly, the negative electrode may have a potential ranging from a lower limit of 0 V or more from an upper limit of 1.0 V or less, specifically 0.8 V or less, or 0.5 V or less, and any combination of each upper limit with each lower limit may be used.

In addition, in the discharge pretreatment step (S3), the potential of the positive electrode is not dropped to less than 1.0 V preferably at the end of the discharge. When the positive electrode potential satisfies the above-defined range, it is unlikely that side reactions, such as formation of an alloy of a positive electrode current collector with a positive electrode active material, occur. According to an embodiment of the present disclosure, at the end of the discharge, the positive electrode may have a potential of 1.0-1.8 V, 1.0-1.5 V, or 1.0-1.2 V. Meanwhile, for example, at the end of the discharge, the negative electrode may have a potential of 0-1.0 V, 0-0.8 V, or 0-0.5 V. Particularly, the negative electrode potential at the end of the discharge may be 0 V or more and 1.0 V or less, 0.8 V or less, or 0.5 V or less.

After carrying out the discharge treatment as described above, there is not a severe difference in potential before and after discharge.

During the discharge pretreatment, the positive electrode potential is decreased and the negative electrode potential is increased due to polarization. However, the positive/negative electrode undergoes a change in potential within such a range that the potential is not higher than the oxidation potential of an electrolyte and is not lower than the reduction potential thereof. Therefore, no side reaction, such as oxidation/reduction of an electrolyte, occurs during the discharge pretreatment.

In addition, since the positive electrode potential is not dropped excessively within the above-defined numeral range, alloys of the positive electrode current collector with the positive electrode active material may not be formed at the positive electrode.

Meanwhile, even after carrying out the discharge pretreatment according to the present disclosure, no side reactions occur, and such side reactions may include collapse of the positive electrode, additional lithium intercalation into the positive electrode, lithium metal deposition at the positive electrode, or the like.

This is because the discharge pretreatment according to an embodiment of the present disclosure allows a drop in positive electrode potential merely to at most 1.2 V. Particularly, lithium has a voltage as shown in the following Formula 2.

$Li^+ + e^- \rightarrow Li$  0 V (vs. $Li^+/Li$)  [Formula 2]

The voltage should be 0 V or less in order to observe lithium metal deposition at the positive electrode according to Formula 2. However, after carrying discharge pretreatment according to the present disclosure, the positive electrode maintains a potential of 1.2-1.8 V. As a result, no lithium metal deposition occurs.

According to an embodiment of the present disclosure, when the negative electrode active material is lithium metal, there is no change in structure of the negative electrode and ingredients in the negative electrode during charge/discharge. However, lithium metal surface merely undergoes plating/exfoliation. In other words, lithium metal is maintained as it is with no change in ingredients, and thus the lithium metal potential may be maintained at 0 V versus lithium.

Meanwhile, in the method for manufacturing an electrochemical device according to the present disclosure, the positive electrode and the negative electrode are maintained in a stable state before the discharge pretreatment step (S3). Therefore, any discharge reaction based on spontaneous oxidation/reduction cannot occur without energy supply from external electric power.

Then, the pretreated battery is charged for the first time to perform formation of the battery (S4).

The formation step is carried out by applying electric current to the electrode assembly including an electrolyte injected thereto to a predetermined voltage.

According to an embodiment of the present disclosure, step (S4) may be carried out by any one selected suitably from a constant current (CC) mode, constant voltage (CV) mode and a constant current-constant voltage (CC-CV) mode, considering the characteristics and final purpose of use of a battery.

During the first charge process for formation, an SEI layer is formed on the surface of the electrode and the electrolyte is decomposed partially to generate a large amount of gases. According to an embodiment of the present disclosure, the method may further include a degassing step wherein the gases are removed.

The other battery elements not described herein may be those used conventionally in the field of secondary batteries.

Hereinabove, the method for manufacturing an electrochemical device has been described. The method for manufacturing an electrochemical device according to the present disclosure allows removal of the byproduct layer on the negative electrode surface through the discharge pretreatment. Therefore, an electrochemical device obtained from the method may have a uniform negative electrode surface and provide excellent life characteristics of a secondary battery.

Examples will be described more fully hereinafter so that the present disclosure can be understood with ease. The following examples may, however, be embodied in many different forms and should not be construed as limited to the exemplary embodiments set forth therein. Rather, these exemplary embodiments are provided so that the present disclosure will be thorough and complete, and will fully convey the scope of the present disclosure to those skilled in the art.

<Determination of Effect of Discharge Pretreatment>

EXAMPLE 1

A positive electrode active material ($LiCoO_2$), conductive material (carbon black) and a binder (PVDF) were introduced to and mixed in N-methyl-2-pyrrolidone (NMP) at a weight ratio of 96:2:2 to prepare positive electrode slurry. The resultant positive electrode slurry was coated on aluminum foil having a thickness of 20 μm to a capacity of 3.1 mAh/cm$^2$ to obtain a positive electrode. As a negative electrode, lithium metal pressed to a thickness of 20 μm on a copper current collector having a thickness of 20 μm was used. A separator (made of polyethylene, thickness: 20 μm) was interposed between the negative electrode and the positive electrode to obtain a coin cell-type electrode assembly. The electrode assembly was introduced to a battery casing, an electrolyte was injected thereto, and then the battery casing was sealed to obtain a battery. The electrolyte was prepared by adding 1M $LiPF_6$ to an organic solvent containing ethylene carbonate (EC) and propylene carbonate (PC) at a ratio of 50:50 (volume ratio).

Next, the battery was discharged by applying external electric power (battery power converter, TOYO system) at 0.1 C in a constant current mode, wherein the lithium secondary battery was in a state of charge (SOC) of 0%. Before the discharge, the positive electrode had a potential of 3 V and the negative electrode had a potential of 0 V. After the discharge, the positive electrode had a potential of 1.5 V and the negative electrode had a potential of 0 V.

Figure 2:
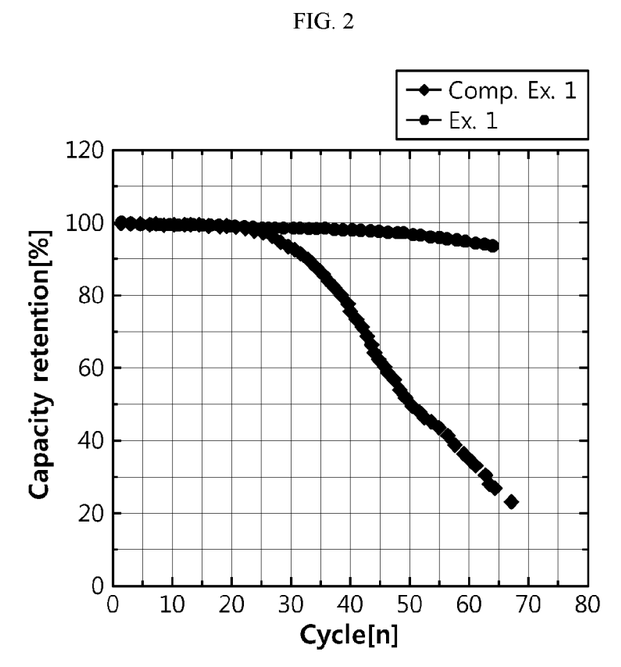
FIG. 2 is graph illustrating the cycle characteristics of the batteries according to Example 1 and Comparative Example 1.

Finally, the pretreated battery was charged for the first time to perform formation of the battery, thereby providing a lithium secondary battery. The first charge was carried out at 0.1 C (C rate) to a charge cut off voltage of 4.2 V in a CC-CV mode. When the state of charge was 100%, the battery was discharged at 0.1 C in a CC mode until the battery showed a voltage of 3 V. The results are shown in FIG. 2.

EXAMPLE 2

Figure 4:
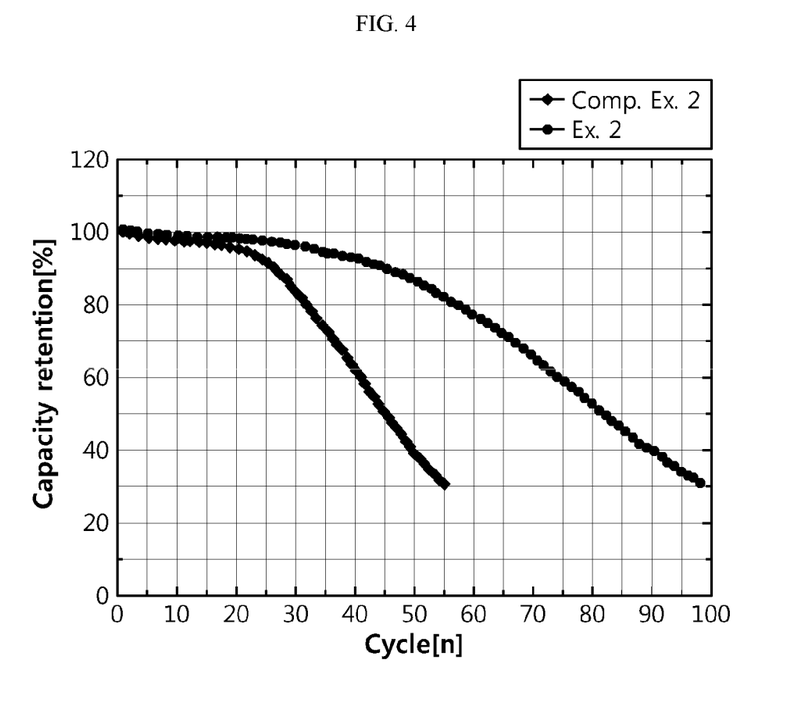
FIG. 4 is a graph illustrating the cycle characteristics of the batteries according to Example 2 and Comparative Example 2.

An electrode assembly was obtained in the same manner as Example 1, except that the electrolyte prepared as described hereinafter was used. Particularly, the electrolyte was prepared by adding 1M $LiPF_6$ to an organic solvent containing ethylene carbonate (EC) and propylene carbonate (PC) at a ratio of 30:70 (volume ratio). The results are shown in FIG. 4.

COMPARATIVE EXAMPLE 1

A battery was obtained in the same manner as Example 1. However, in Comparative Example 1, the battery was charged for the first time right after it was obtained without the pretreatment step of discharging the battery by applying external electric power thereto. The results are shown in FIG. 2.

COMPARATIVE EXAMPLE 2

A battery was obtained in the same manner as Example 2. However, in Comparative Example 2, the battery was charged for the first time right after it was obtained without the pretreatment step of discharging the battery by applying external electric power thereto. The results are shown in FIG. 4.

COMPARATIVE EXAMPLE 3

Figure 5:
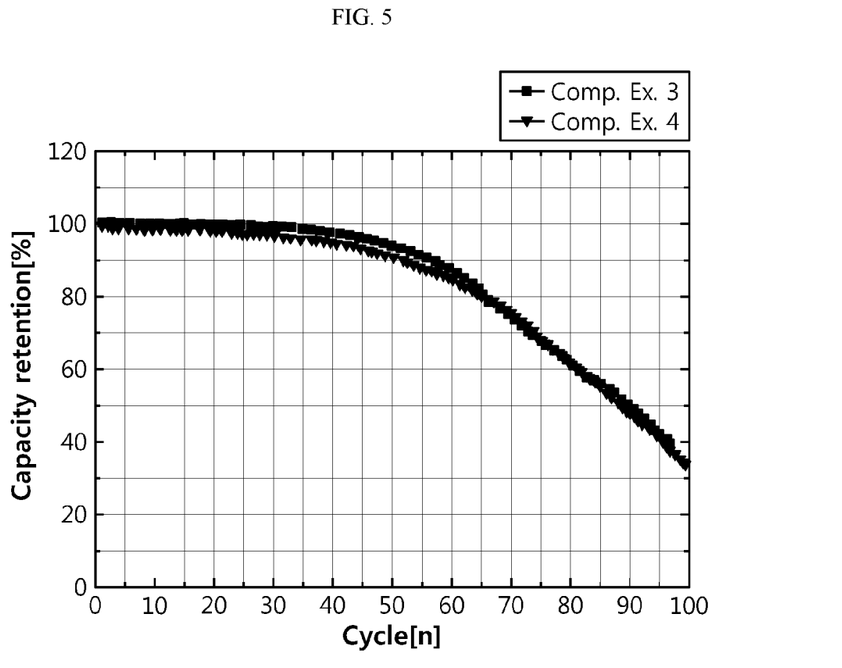
FIG. 5 is a graph illustrating the cycle characteristics of the batteries according to Comparative Examples 3 and 4.

A battery was obtained in the same manner as Example 1, except that the electrolyte prepared as described hereinafter was used. Particularly, the electrolyte was prepared by adding 1M $LiPF_6$ to an organic solvent containing fluoroethylene carbonate (FEC) and ethylmethyl carbonate (EMC) at a ratio of 30:70 (volume ratio). The results are shown in FIG. 5.

COMPARATIVE EXAMPLE 4

A battery was obtained in the same manner as Comparative Example 3. However, in Comparative Example 4, the battery was charged for the first time right after it was obtained without the pretreatment step of discharging the battery by applying external electric power thereto. The results are shown in FIG. 5.

<Determination of Reactivity with Lithium Metal Depending on Particular Type of Electrolyte>

Tests 1A to 1E

Electrolytes were prepared as shown in the following Table 1 to determine the reactivity with lithium metal according to the method for determining the reactivity with lithium metal depending on the particular type of an electrolyte. The results are shown in FIG. 8. The electrolyte used in Test 1A was the same as the electrolyte used in Example 1, and the electrolyte used in Test 1E was the same as the electrolyte used in Comparative Example 3.

It can be seen from the data of FIG. 8 that use of the electrolyte according to Test 1A shows low reactivity with lithium metal. It can be seen from the results of FIG. 2 that the discharge pretreatment improves the life characteristics of a battery.

TABLE 1

|  | Test 1A | Test 1B | Test 1C | Test 1D | Test 1E |
|---|---|---|---|---|---|
| Composition of electrolyte (volume ratio) | Ethylene carbonate:propylene carbonate = 50:50 | Dimethyl carbonate = 100 | 1,2-dimethoxyethane = 100 | Ethyl acetate = 100 | Fluoroethylene carbonate:ethylmethyl carbonate = 30:70 |
| Concentration of lithium salt ($LiPF_6$) | 1M | 2.5M | 2.5M | 2.5M | 1M |

Tests 2A to 2C

Electrolytes were prepared as shown in the following Table 2 to determine the reactivity with lithium metal depending on lithium salt concentration. The results are shown in FIG. 9.

TABLE 2

|  | Test 2A | Test 2B | Test 2C |
|---|---|---|---|
| Composition of electrolyte (volume ratio) | Dimethyl carbonate = 100 | Dimethyl carbonate = 100 | Dimethyl carbonate = 100 |
| Concentration of lithium salt ($LiPF_6$) | 2.0M | 1.5M | 1.0M |

Determination of Cycle Characteristics

Each of the batteries according to Examples 1 and 2 and Comparative Examples 1 to 4 was charged at 0.2 C under a temperature condition of 25° C. to 4.2 V in a CC-CV mode, and discharged at 0.5C to 3V in a constant current mode. This was repeated for 65 cycles to determine the capacity retention of each battery. The results are shown in FIG. 2, FIG. 4 and FIG. 5. It can be seen from that the battery according to Example 1 constantly maintains a capacity retention of about 100%, while Comparative Example 1 shows a significant drop in capacity retention after the 20th cycle. Therefore, the method for manufacturing an electrochemical device according to the present disclosure is significantly effective for improving the life of a battery.

Meanwhile, it can be seen from FIG. 4 and FIG. 5 that the use of an organic solvent (Examples 1 and 2) having low reactivity with lithium metal, i.e., an organic solvent satisfying the above Formula 1, significantly improves capacity retention, as compared to the use of an organic solvent (Comparative Examples 3 and 4) having high reactivity with lithium metal.

Meanwhile, in the case of Example 2 using an organic solvent containing ethylene carbonate and propylene carbonate at a ratio of 30:70, it shows higher capacity retention, as compared to Example 1 using an organic solvent containing ethylene carbonate and propylene carbonate at a ratio of 50:50. On the contrary, when using an electrolyte having high reactivity with lithium metal in the case of Comparative Examples 3 and 4, there is no significant difference in capacity retention even after carrying out discharge pretreatment. This is shown in FIG. 5. It is thought that this is because the use of an electrolyte having high reactivity with lithium metal causes formation of a new byproduct layer, since the electrolyte is in contact with the negative electrode surface again even after carrying out discharge pretreatment, and thus provides an insufficient effect of improving life characteristics.

As shown in FIG. 6, the present inventors have found that when the battery using an electrolyte having low reactivity with lithium material is subjected to a discharge pretreatment step, like Example 1, it is possible to provide a significantly high effect of improving life characteristics. On the contrary, like Comparative Example 3, when a battery using an electrolyte having high reactivity with lithium metal is subjected to discharge pretreatment, it is not possible to provide a sufficient effect of improving life characteristics.

TEST EXAMPLE

Method for Determining Reactivity with Lithium Metal Depending on Particular Type of Electrolyte The charge transfer resistance (CTR) is calculated by injecting the electrolyte to a lithium/lithium symmetric beaker cell obtained by using lithium foil and plotting the values measured by using electrochemical impedance spectroscopy (EIS) as a function of time, the initial charge transfer resistance is the charge transfer resistance right after injecting the electrolyte to the lithium/lithium electrode, and the final charge transfer resistance is the charge transfer resistance 18 hours after injecting the electrolyte to the lithium/lithium electrode.

Particularly, according to the present disclosure, the results were analyzed by using the equivalent circuit model as shown in FIG. 7 after carrying out the electrochemical impedance spectroscopy.

The equivalent circuit model includes the electrolyte resistance (Rs), charge transfer resistance (R1) at the interface between the electrolyte and the electrode, a constant phase element (CPE) and Warburg impedance (Wo).

What is claimed is:
1. A method for manufacturing an electrochemical device, comprising the steps of:
  forming an electrode assembly including a negative electrode, a positive electrode and a separator interposed between the negative electrode and the positive electrode;
  introducing the electrode assembly to a battery casing, injecting an electrolyte into the battery casing and sealing the battery casing to obtain a battery;
  carrying out pretreatment by applying external electric power to the battery to discharge the battery to provide a pretreated battery; and
  charging the pretreated battery for the first time to complete formation of the battery,
  wherein the electrolyte comprises an organic solvent and a lithium salt, and
  prior to injecting the electrolyte into the battery, determining that the electrolyte satisfies the following Formula 1:

$$[(\text{Final charge transfer resistance} - \text{Initial charge transfer resistance})/\text{Final charge transfer resistance}] \times 100 < 100\%, \quad \text{[Formula 1]}$$

wherein a charge transfer resistance (CTR) is calculated by injecting the electrolyte to a lithium/lithium symmetric beaker cell obtained by using lithium metal and plotting the values measured by using electrochemical impedance spectroscopy (EIS) as a function of time,
  the initial charge transfer resistance is the charge transfer resistance right after injecting the electrolyte to the lithium/lithium symmetric beaker cell, and
  the final charge transfer resistance is the charge transfer resistance 18 hours after injecting the electrolyte to the lithium/lithium symmetric beaker cell
  wherein the organic solvent of the electrolyte comprises ethylene carbonate and propylene carbonate, and
  wherein a volume ratio of ethylene carbonate to propylene carbonate is 30:70-50:50.

2. The method for manufacturing an electrochemical device according to claim 1, wherein the carrying out pretreatment step is carried out twice or more.

3. The method for manufacturing an electrochemical device according to claim 1, wherein the carrying out pretreatment step comprises the following steps:
  carrying out a first discharge pretreatment;
  resting the battery to increase the voltage of the battery; and
  carrying out a second discharge pretreatment.

4. The method for manufacturing an electrochemical device according to claim 1, wherein the negative electrode has a potential of 0-1.0V before the carrying out pretreatment step.

5. The method for manufacturing an electrochemical device according to claim 1, wherein the positive electrode has a potential of 1.0V or more and the negative electrode has a potential of 0-1.0V at the end of the carrying out pretreatment step.

6. The method for manufacturing an electrochemical device according to claim 1, which further comprises a step of analyzing a byproduct layer formed during injecting the electrolyte into the battery casing before the carrying out pretreatment step.

7. The method for manufacturing an electrochemical device according to claim 1, wherein the carrying out pretreatment step is carried out by converting a battery capacity as a function of a thickness of a byproduct layer formed during injecting the electrolyte into the battery casing.

8. The method for manufacturing an electrochemical device according to claim 1, wherein the negative electrode comprises, as a negative electrode active material, any one of alkali metals, alkaline earth metals, Group 3B metals and transition metals, or combinations thereof.

9. The method for manufacturing an electrochemical device according to claim 8, wherein the alkali metals include any one of lithium (Li), sodium (Na), potassium (K), rubidium (Rb), cesium (Cs), francium (Fr), or combinations thereof.

10. The method for manufacturing an electrochemical device according to claim 1, wherein the positive electrode comprises, as a positive electrode active material, any one selected from the group consisting of $LiCoO_2$, $LiNiO_2$, $LiMn_2O_4$, $LiCoPO_4$, $LiFePO_4$, $LiNiMnCoO_2$, $LiNi_{1-x-y-z}Co_xM1_yM2_zO_2$ (wherein each of M1 and M2 independently represents any one selected from the group consisting of Al, Ni, Co, Fe, Mn, V, Cr, Ti, W, Ta, Mg and Mo, each of x, y and z independently represents an atomic proportion of an element forming the oxides, and $0 \leq x < 0.5$, $0 \leq y < 0.5$, $0 \leq z < 0.5$, $0 < x+y+z \leq 1$), and mixtures thereof.

11. The method for manufacturing an electrochemical device according to claim 1, wherein the electrochemical device is a lithium metal battery.

12. The method for manufacturing an electrochemical device according to claim 1, wherein the lithium salt has a molar concentration of 0.5 M to 1.5 M.

* * * * *